United States Patent
Li

(10) Patent No.: US 10,353,439 B2
(45) Date of Patent: Jul. 16, 2019

(54) MOBILE TERMINAL, HOUSING ASSEMBLY, AND METHOD FOR MANUFACTURING THE SAME

(71) Applicant: GUANGDONG OPPO MOBILE TELECOMMUNICATIONS CORP., LTD., Dongguan (CN)

(72) Inventor: Feifei Li, Dongguan (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 36 days.

(21) Appl. No.: 15/683,815

(22) Filed: Aug. 23, 2017

(65) Prior Publication Data

US 2018/0074559 A1  Mar. 15, 2018

(30) Foreign Application Priority Data

Sep. 9, 2016 (CN) .......................... 2016 1 0814478
Sep. 9, 2016 (CN) ..................... 2016 2 1047429 U

(51) Int. Cl.
| | |
|---|---|
| G06F 1/16 | (2006.01) |
| H05K 5/06 | (2006.01) |
| H04M 1/02 | (2006.01) |
| H04M 1/18 | (2006.01) |
| H01R 43/20 | (2006.01) |

(52) U.S. Cl.
CPC ......... *G06F 1/1683* (2013.01); *H01R 43/205* (2013.01); *H04M 1/0277* (2013.01); *H04M 1/18* (2013.01); *H05K 5/069* (2013.01); *G06F 1/1656* (2013.01); *H04M 1/0274* (2013.01)

(58) Field of Classification Search
CPC ... G06F 1/1683; G06F 1/1656; H01R 43/205; H05K 5/069; H04M 1/18; H04M 1/0277; H04M 1/0274
See application file for complete search history.

(56) References Cited

U.S. PATENT DOCUMENTS 8,575,499 B2 * 11/2013 Hayashi ................. H05K 1/118
174/539
2006/0185881 A1   8/2006 Minoshima et al.
2009/0250261 A1   10/2009 Hayashi et al.
(Continued)

FOREIGN PATENT DOCUMENTS

| CN | 201185232 | 1/2009 |
|---|---|---|
| CN | 201781708 U | 3/2011 |

(Continued)

OTHER PUBLICATIONS

English Translation of Shiba-Daimon JP 3127071.*

*Primary Examiner* — Abhishek M Rathod
(74) *Attorney, Agent, or Firm* — Ladas & Parry LLP; Loren K. Thompson

(57) ABSTRACT

A housing assembly for a mobile terminal includes a housing body, a circuit board, and a fixing member. The housing body has a wiring hole. The circuit board is disposed in the housing body and has an end which passes through the wiring hole and extends out of the housing body. The fixing member is sleevedly attached to the circuit board and engages with the circuit board. An outer sidewall of the fixing member is attached to an inner sidewall of the wiring hole.

15 Claims, 5 Drawing Sheets

(56) References Cited

U.S. PATENT DOCUMENTS

| | | | |
|---|---|---|---|
| 2011/0031703 A1* | 2/2011 | Hayashi | G01D 11/245 |
| | | | 277/626 |
| 2014/0083761 A1* | 3/2014 | Wee | H05K 5/069 |
| | | | 174/650 |
| 2014/0085836 A1 | 3/2014 | Mo et al. | |
| 2014/0285985 A1* | 9/2014 | Tanaka | H05K 5/0069 |
| | | | 361/752 |
| 2015/0180158 A1 | 6/2015 | Arai et al. | |
| 2017/0133173 A1 | 5/2017 | Wu et al. | |
| 2018/0074559 A1 | 3/2018 | Li | |

FOREIGN PATENT DOCUMENTS

| | | |
|---|---|---|
| CN | 203827658 U | 9/2014 |
| CN | 104247163 A | 12/2014 |
| CN | 104282475 A | 1/2015 |
| CN | 204129276 U | 1/2015 |
| CN | 204424556 U | 6/2015 |
| CN | 204498512 U | 7/2015 |
| CN | 105101716 A | 11/2015 |
| CN | 204887772 U | 12/2015 |
| CN | 205029730 U | 2/2016 |
| CN | 106255369 A | 12/2016 |
| CN | 205993042 U | 3/2017 |
| CN | 206181018 U | 5/2017 |
| EP | 1496587 A1 | 1/2005 |
| EP | 2068607 A1 | 6/2009 |
| JP | 3127071 U | 11/2006 |

\* cited by examiner

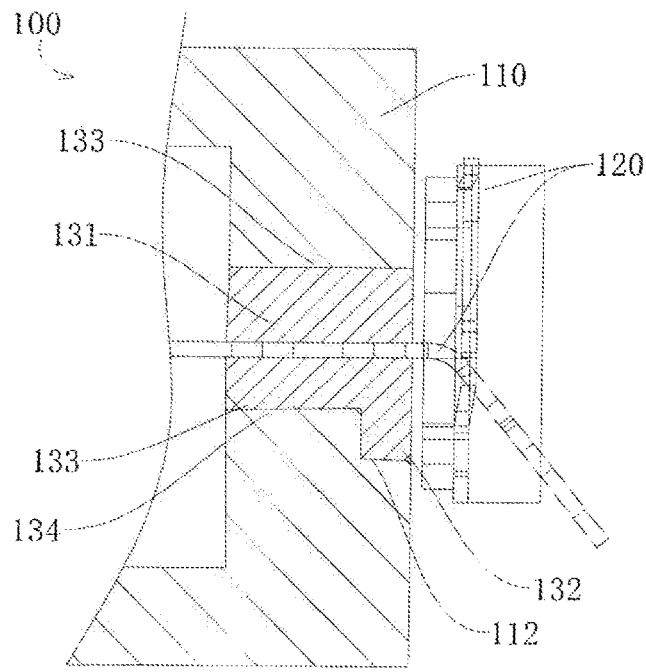

FIG. 4

```
┌─────────────────────────────────────────────────┐
│ SLEEVEDLY ATTACHING A FIXING MEMBER ON A        │──10
│ CIRCUIT BOARD, WHEREIN THE FIXING MEMBER        │
│ IS FIXEDLY CONNECTED WITH THE CIRCUIT           │
│ BOARD TO FORM A CIRCUIT BOARD MODULE            │
└─────────────────────────────────────────────────┘
                       │
                       ▼
┌─────────────────────────────────────────────────┐
│ INSTALLING THE CIRCUIT BOARD MODULE IN A        │──20
│ HOUSING BODY, WHEREIN AN OUTER SIDEWALL         │
│ OF THE FIXING MEMBER IS ATTACHED TO AN          │
│ INNER SIDEWALL OF A WIRING HOLE OF THE          │
│ HOUSING BODY                                    │
└─────────────────────────────────────────────────┘
```

FIG. 5

MOBILE TERMINAL, HOUSING ASSEMBLY, AND METHOD FOR MANUFACTURING THE SAME

CROSS REFERENCE TO RELATED APPLICATIONS

This application is a non-provisional patent application, which claims priority to Chinese Application No. 201610814478.7, filed on Sep. 9, 2016 and Chinese Application No. 201621047429.7, filed on Sep. 9, 2016. The entire disclosure of each of the above applications is incorporated herein by reference.

BACKGROUND

1. Field

The present disclosure relates to the field of electronic equipment technology, and in particular, to a mobile terminal, a housing assembly, and a method for manufacturing the same.

2. Description of the Related Art

With the development of wireless communication and electronic information technology, there are even more uses for electronic products. In seeking better functionality, there is a great demand for waterproofing in electronic products, especially mobile terminals, such as mobile phones in special environments such as outdoors, humid environments, underwater, rain, etc.

In order to conveniently connect an external component and an internal component of a mobile terminal, there is a need to form a through hole in a housing of the mobile terminal and use a circuit board to connect the external component and the internal component of the mobile terminal. However, the design of the through hole in the housing affects the waterproofing of the mobile terminal.

BRIEF DESCRIPTION OF THE DRAWINGS

FIG. 4 is a diagram showing a partial cross section of the housing assembly of the mobile terminal according to an embodiment of the present disclosure.

FIG. 5 is a flowchart of a method for manufacturing the housing assembly according to an embodiment of the present disclosure.

DETAILED DESCRIPTION OF THE PREFERRED EMBODIMENTS

Figure 1:
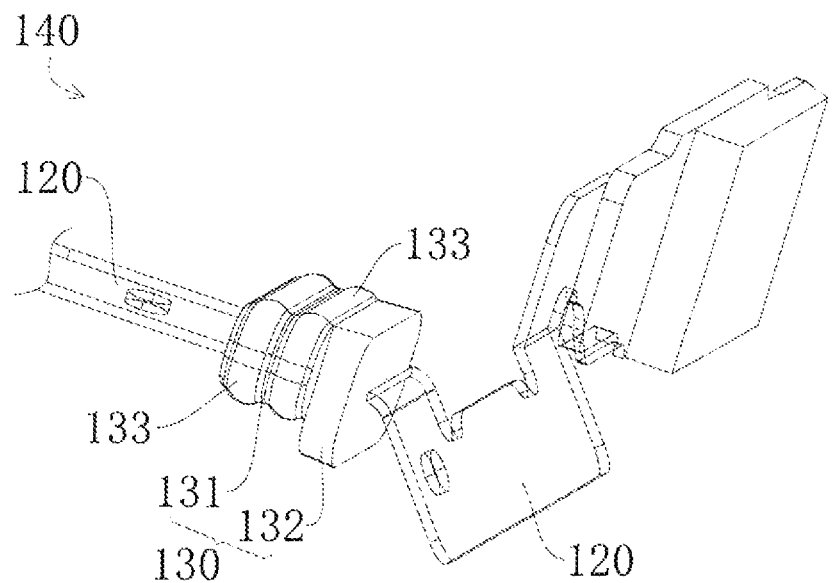
FIG. 1 is a diagram showing a partial structure of a housing assembly of a mobile terminal according to an embodiment of the present disclosure.

The following will describe the embodiments of the present disclosure in detail with reference to the accompanying drawings. The embodiments described with reference to the accompanying drawings are provided merely by way of explanation of the disclosure, not by way of limitation of the disclosure.

In the description of the present disclosure, it is appreciated that the orientation or position relationship indicated by terms such as "center", "length", "width", "thickness", "upper", "lower", "front", "rear", "left", "right", "inner", "outer", "axial", "radial", "circumferential", etc., are only introduced based on the orientation or position relationship illustrated in the drawings in order to describe the present disclosure and simplify the description and not to indicate or imply the indicated device or component must have a specific orientation or must be constructed or operated with a specific orientation. Therefore, they are by no means to be understood as limits to the present disclosure.

In addition, terms such as "first" and "second" are used herein for purposes of description and are not intended to indicate or imply relative importance or significance or to imply the number of indicated technical features. Thus, the feature defined with "first" and "second" may include one or more of this feature. In the description of the present disclosure, "a plurality of" means two or more than two, unless specified otherwise.

In the present disclosure, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

The following describes a housing assembly 100 of a mobile terminal 200 of an embodiment in accordance with the present disclosure in detail with reference to the accompanying FIG. 1 to FIG. 4. It should be noted that the mobile terminal may be a mobile phone, a tablet computer, or a laptop computer. The mobile terminal 200 may use the housing assembly 100, to protect internal electronic components of the mobile terminal 200.

As illustrated in FIGS. 1 to 4, the housing assembly 100 of the mobile terminal 200 according to the embodiment of the present disclosure includes a housing body 110, a circuit board 120, and a fixing member 130.

The housing body 110 has a wiring hole 111 and is configured to accommodate electronic components of the mobile terminal 200. The circuit board 120 is disposed in the housing body 110. The circuit board 120 has one end passing through the wiring hole 111 and extending out of the housing body 110. Thus, it is convenient for the circuit board 120 to electrically connect internal components inside the housing body 110 with external components outside the housing body 110. For example, as illustrated in FIG. 4, a right end of the circuit board 120 passes through the wiring hole 111 and extends out from the right side (right side as illustrated in FIG. 4) of the housing body 110. A left end of the circuit board 120 may be electrically connected with a component (such as a main control board) inside the housing body 110. The right end of the circuit board 120 may be electrically connected with a component (such as a button, a USB interface or a headset jack) outside the housing body 110. Thus, the components inside and outside the housing body 110 can be electrically connected.

Figure 2:
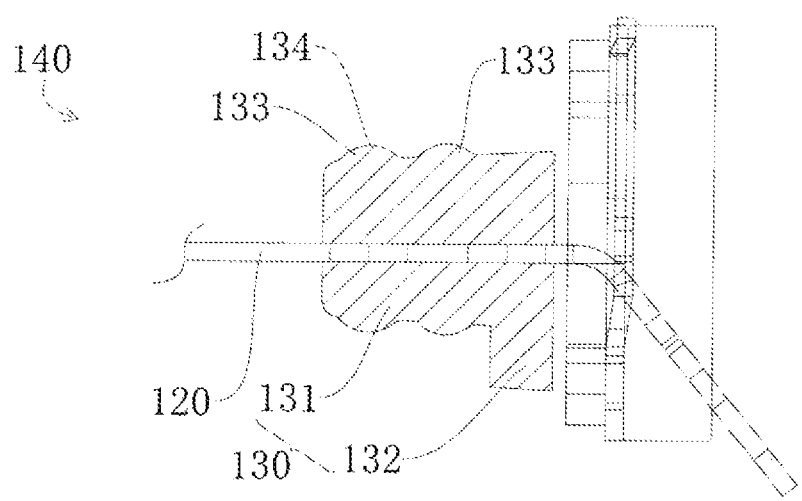
FIG. 2 is a diagram showing a partial cross section of the housing assembly of the mobile terminal according to an embodiment of the present disclosure.

As illustrated in FIG. 1 and FIG. 2, the fixing member 130 is sleevedly mounted on the circuit board 120 and engages with the circuit board 120. An outer sidewall of the fixing member 130 is attached to an inner sidewall of the wiring hole 111. It is appreciated that, by sleevedly attaching the fixing member 130 on the circuit board 120, the circuit board 120 and the fixing member 130 can be modularized, and therefore the modularized circuit board 120 and the fixing member 130 can be installed in the housing body 110, and then the outer sidewall of the fixing member 130 is attached to the inner sidewall of the wiring hole 111. Thus, not only can it simplify assembling process of the housing assembly, it also can enhance the waterproofing at the wiring hole 111.

In the housing assembly 100 of the mobile terminal 200 according to the embodiment of the present disclosure, by attaching the fixing member 130 on the circuit board 120 and installing the circuit board 120 on the housing body 110 using the fixing member 130, assembling process of the housing assembly 100 is simplified and efficiency of the assembling is improved. Additionally, with the outer sidewall of the fixing member 130 being attached to the inner sidewall of the wiring hole 111, liquid can be prevented from entering the interior of the housing body 110 through the wiring hole 111, thereby effectively enhancing the waterproofing of the housing body 110.

According an embodiment of the present disclosure, as illustrated in FIGS. 1 and 2, the fixing member 130 may include a body portion 131 and a stopper portion 132. The body portion 131 can be sleevedly mounted on the circuit board 120. The stopper portion 132 can be mounted on the body portion 131 and close to an exterior of the housing body 110. The stopper portion 132 protrudes out from an outer peripheral wall of the body portion 131 and extends in a peripheral direction of the body portion 131. In one aspect, the contact area between the fixing member 130 and the housing body 110 can be increased to enhance the stability of the engagement between the circuit board 120 and the housing body 110 and to enhance the waterproofing of the housing body 110 at the wiring hole 111. In another aspect, the stopper portion 132 can prevent the fixing member 130 from entering the interior of the housing body 110 under an external force.

Figure 3:
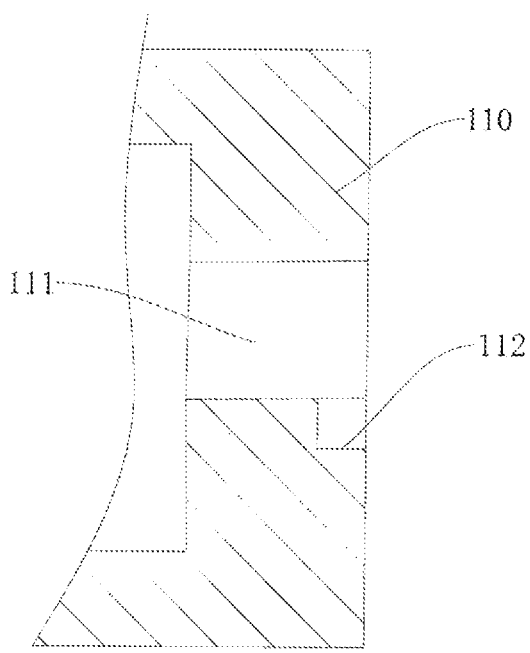
FIG. 3 is a diagram showing a cross section of a housing body of the housing assembly of the mobile terminal according to an embodiment of the present disclosure.

Furthermore, as illustrated in FIG. 3 and FIG. 4, the housing body 110 has a stopper slot 112 in communication with the wiring hole 111. The stopper portion 132 is adapted to be embedded in the stopper slot 112. Thus, the waterproofing of the housing body 110 at the wiring hole 111 can be enhanced, and the outer appearance of the housing body 110 can be improved, so that the outer structure of the housing body 110 becomes more smooth and beautiful.

According to an embodiment of the present disclosure, as illustrated in FIGS. 1 and 2, the outer sidewall of the fixing member 130 is provided with at least one protrusion 133. The at least one protrusion 133 protrudes from the outer sidewall of the fixing member 130. With the protrusion 133, the fixing member 130 can be tightly engaged with the wiring hole 111 so as to prevent liquid from entering the interior of the housing body 110 through a gap between the inner sidewall of the wiring hole 111 and the outer sidewall of the fixing member 130, thereby enhancing the waterproofing of the housing body 110. In the example illustrated in FIG. 1 and FIG. 2, the protrusion 133 is bar-shaped or ring-shaped and extends in a peripheral direction of the fixing member 130. The protrusion 133 may be used as a waterproof structure surrounding the exterior of the fixing member 130, thereby preventing liquid from entering the interior of the housing body 110 through a gap between the wiring hole 111 and the fixing member 130, thereby further enhancing waterproofing of the housing body 110. It should be noted that the structure of the protrusion 133 is not limited to the foregoing structure. For example, the fixing member 130 may have a plurality of protrusions 133, and the plurality of protrusions 133 are arranged at intervals in a peripheral direction of the fixing member 130.

In one embodiment of the present disclosure, the fixing member 130 has a plurality of protrusions 133 which are arranged at intervals in an extension direction of the circuit board 120, as the lateral direction of FIG. 2, that is, the height direction of the fixing member 130. For example, as illustrated in FIG. 2, the protrusions 133 are arranged at intervals along the lateral direction (that is, the height direction of the fixing member 130) of FIG. 2. The protrusions 133 can be used as waterproof structures so as to effectively prevent liquid from entering the interior of the housing body 110 through the gap between the wiring hole 111 and the fixing member 130.

In order to further enhance the waterproofing between the fixing member 130 and the housing body 110, in an embodiment of the present disclosure, an adhesive layer is disposed between the outer sidewall of the fixing member 130 and the inner sidewall of the wiring hole ill. The adhesive layer may be formed between the outer sidewall of the fixing member 130 and the inner sidewall of the wiring hole 111 by adhesive dispensing.

As illustrated in FIG. 2, in order to easily mount the fixing member 130 in the wiring hole 111, in an embodiment of the present disclosure, a free end of the protrusion 133 is provided with a curved surface 134. According to an embodiment of the present disclosure, the circuit board 20 may be a flexible circuit board. According to an embodiment of the present disclosure, the fixing member 130 may be an elastic fixing member 130. When mounting the fixing member 130 to the wiring hole 111 of the housing body 110, the elastic fixing member 130 can be tightly attached to the inner sidewall of the wiring hole 111, thereby effectively enhancing waterproofing at the wiring hole 111. The elastic fixing member 130 may be a plastic member or a resin member. When mounting the fixing member 130 onto the housing body 110, the fixing member 130 may be deformed to some extent and then be mounted in the wiring hole 110 in a way of extruding. Therefore, the outer sidewall of the fixing member 130 and the inner sidewall of the wiring hole 111 can be tightly engaged to effectively enhance waterproofing at the wiring hole 111.

The following describes the housing assembly 100 of the mobile terminal 200 of an embodiment in accordance with the present disclosure in detail with reference to the accompanying FIG. 1 to FIG. 4. The mobile terminal 200 may be a mobile phone, a tablet computer or a laptop computer. The housing assembly 100 may be used on the mobile terminal 200 to protect components inside the mobile terminal 200. It is appreciated that the following descriptions are merely exemplary, and not construed to limit the present disclosure.

First Embodiment

As illustrated in FIGS. 1 to 4, the housing assembly 100 includes a housing body 110, a circuit board 120, and a fixing member 130.

Specifically, the housing body 110 has a wiring hole 111. The circuit board 120 is a flexible circuit board disposed in the housing body 110. A right end of the circuit board 120 passes through the wiring hole 111 and extends out from the a right side of the housing body 110. A left end of the circuit board 120 may be electrically connected with a component (such as a main control board) inside the housing body 110; and the right end of the circuit board 120 may be electrically connected with a component (such as a button, a USB interface or a headset jack) outside the housing body 110.

Thus, the components inside and outside the housing body 110 can be electrically connected.

As illustrated in FIG. 1 and FIG. 2, the fixing member 130 is sleevedly mounted on the circuit board 120 and engages with the circuit board 120. The outer sidewall of the fixing member 130 is attached to the inner sidewall of the wiring hole ill. When assembling, the fixing member 130 is sleevedly mounted on the circuit board 120 at first, that is, modularizing the circuit board 120 and the fixing member 130, and then the modularized circuit board 120 and the fixing member 130 are installed on the housing body 110. The outer sidewall of the fixing member 130 is attached to the inner sidewall of the wiring hole 111. Therefore, it is possible to simplify the assembling process of the housing assembly 100 and prevent liquid from entering the interior of the housing body 110 through the wiring hole 111, thereby can effectively enhance waterproofing of the housing body 110.

In the related art, when installing the circuit board on the housing body, the circuit board has to pass through the wiring hole and then be fixed in the wiring hole by adhesive dispensing or adhesive tape. For this kind of assembling method, the assembling process is complicated and waterproofing of the housing body is affected. In order to enhance the waterproofing of a mobile terminal, an independent waterproof design for the wiring hole is desired, thereby making the waterproof design of the mobile terminal more complicated. However, in this embodiment, by mounting the fixing member 130 on the circuit board 120 and installing the circuit 120 in the housing body 110 with aid of the fixing member 130, the assembling process of the housing assembly 100 can be simplified, the efficiency of the assembling can be improved, and the waterproof design of the housing body 110 can be simplified. It is able to prevent liquid from entering the interior of the housing body 110 via the wiring hole 111 and thus can effectively enhance the waterproofing of the housing body 110.

As illustrated in FIG. 1 and FIG. 2, the fixing member 130 is an elastic plastic member and includes a body portion 131 and a stopper portion 132. Specifically, the body portion 131 is sleevedly mounted on the circuit board 120. The stopper portion 132 is mounted on the body portion 131 and close to the exterior of the housing body 110. The stopper portion 132 protrudes out from the outer peripheral wall of body portion 131 and extends in a peripheral direction of the body portion 131. The contact area between the fixing member 130 and the housing body 110 can be increased. The stopper portion 132 can prevent the fixing member 130 from entering the interior of housing body 110 under an external force. Thus, the stability of the engagement between the circuit board 120 and the housing body 110 can be improved, and the waterproofing of the housing body 110 at the wiring hole 111 can be enhanced.

As illustrated in FIG. 3 and FIG. 4, the housing body 110 has a stopper slot 112 in communication with the wiring hole 111. The stopper portion 132 is adapted to be embedded in the stopper slot 112. Thus, the waterproofing of the housing body 110 at the wiring hole 111 can be improved, and the outer appearance of the housing body 110 can be improved, so that the outer structure of the housing body 110 becomes more smooth. As illustrated in FIG. 1 and FIG. 2, the outer sidewall of the fixing member 130 is provided with at least one protrusion 133. The at least one protrusion 133 protrudes from the outer sidewall of the fixing member 130. The protrusion 133 is ring-shaped and is used as a waterproof structure that surrounds the periphery of the fixing member 130, thereby preventing liquid from entering the interior of the housing body 110 via a gap between the wiring hole 111 and the fixing member 130 and thus further enhancing the waterproofing of the housing body 110. When the fixing member 130 is engaged with the wiring hole 111, the protrusion 133 may be deformed by extruding to be tightly engaged with the inner sidewall of the wiring hole 111. Therefore, the attachment between the fixing member 130 and the wiring hole 111 can be effectively enhanced, thereby enhancing the waterproofing at the wiring hole 111.

As illustrated in FIG. 2 there may be a plurality of protrusions 133. The protrusions 133 are arranged at intervals along the lateral direction of FIG. 2. The protrusions 133 can be used as waterproof structures so as to effectively prevent liquid from entering the interior of the housing body 110 through the gap between the wiring hole 111 and the fixing member 130.

In order to further enhance the waterproofing between the fixing member 130 and the housing body 110, an adhesive layer is disposed between the outer sidewall of the fixing member 130 and the inner sidewall of the wiring hole 111. The adhesive layer may be applied on a part of the outer sidewall of the fixing member 130. The adhesive layer may be formed between the outer sidewall of the fixing member 130 and the inner sidewall of the wiring hole 111 by adhesive dispensing. The adhesive layer may be disposed close to the opening of the wiring hole 111, for example, the adhesive layer may be disposed on a sidewall surface of the wiring hole 111 close to the housing body 110. As illustrated in FIG. 2, in order to easily mount the fixing member 130 in the wiring hole 111, a free end of each of the protrusions 133 can be formed to have a curved surface 134.

When assembling, the fixing member 130 can be sleevedly mounted on the flexible circuit board at first by plastic injection molding to form a circuit board module 140, and then the circuit board module 140 is installed in the wiring hole 111 of the housing body 110. As illustrated in FIG. 3 and FIG. 4, the fixing member 130 is deformed by extruding to be mounted in the wiring hole 111. The protrusions on the fixing member 130 deforms due to extrusion and are tightly attached to the inner sidewall of the wiring hole 111 so as to have an effect of waterproof. The stopper portion 132 of the fixing member 130 is embedded in the stopper slot 112 of the housing body 110, thereby enhancing assembling stability between the circuit board module 140 and the housing body 110.

Second Embodiment

The second embodiment differs from the first embodiment in that: the fixing member 130 has a plurality of protrusions 133. The protrusions 133 are arranged at intervals in a peripheral direction of the fixing member 133. Each of the protrusions 133 extends in a height direction of the fixing member 130.

Figure 6:
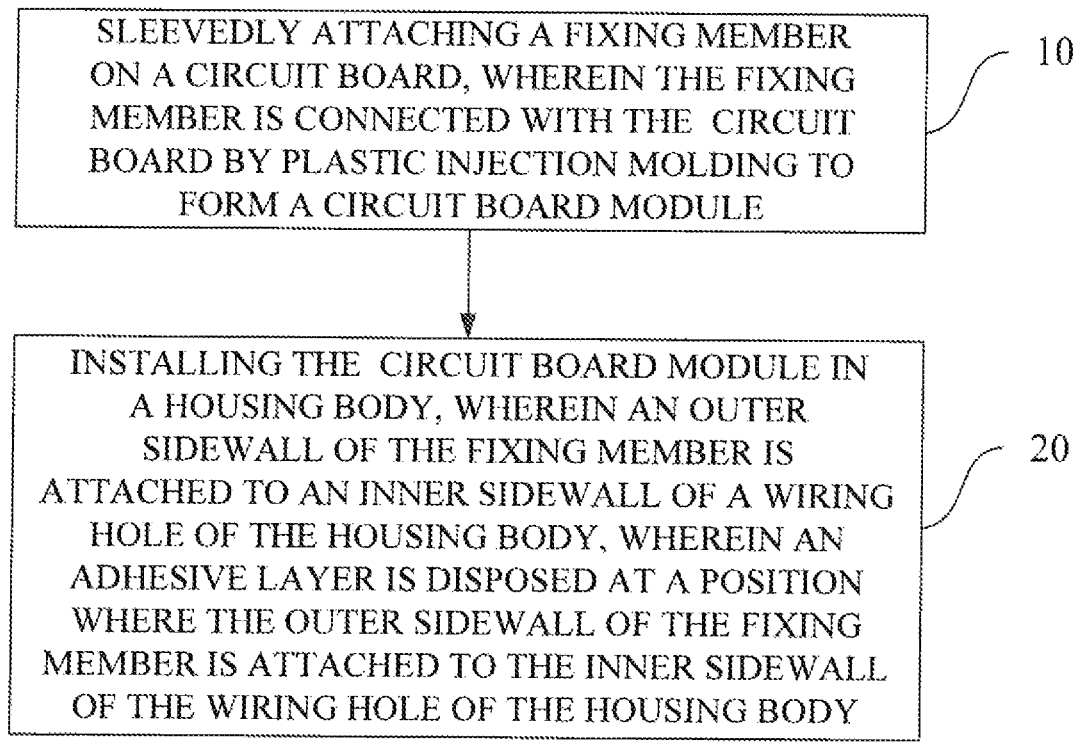
FIG. 6 is a flowchart of a method for manufacturing the housing assembly according to another embodiment of the present disclosure.

The following describes a method for manufacturing the housing assembly 100 according to an embodiment of the present disclosure in detail with reference to the accompanying FIG. 5 and FIG. 6. It should be noted that the housing assembly 100 is the same as the foregoing housing assembly 100 of the mobile terminal 200. The method can begin at block 10.

At block 10, the fixing member 130 is attached on the circuit board 120, and the fixing member 130 is engages with the circuit board 120 to form a circuit board module 140. By modularizing the circuit board 120 and the fixing member 130 in advance, it is easier to install the circuit board 120 on the housing body 110.

At block 20, the circuit board module 140 is installed in the housing body 110, and the outer sidewall of the fixing member 130 is attached to the inner sidewall of the wiring hole 111 of the housing body 110. Thus, liquid can be prevented from entering the interior of the housing body 110 via the wiring hole 111, thereby effectively enhancing the waterproofing of the housing body 110.

In the method for manufacturing the housing assembly 100 according to the embodiment of the present disclosure, by attaching the fixing member 130 on the circuit board 120 and installing the circuit board 120 on the housing body 110 with aid of the fixing member 130, the assembling process of the housing assembly 100 can be simplified and the efficiency of the assembling can be improved. Additionally, with the outer sidewall of the fixing member 130 being attached to the inner sidewall of the wiring hole 111, liquid can be prevented from entering the interior of the housing body 110 through the wiring hole 111, thereby effectively enhancing waterproofing of housing body 110.

According to an embodiment of the present disclosure, as illustrated in FIG. 6, at block 10, the fixing member 130 is formed on the circuit board 120 by plastic injection molding. That is, the fixing member 130 is formed on the circuit board 120 using a plastic injection molding technology. Therefore, the assembling process of the fixing member 130 and the circuit board 120 is simplified. According to an embodiment of the present disclosure, as illustrated in FIG. 6, at block 20, an adhesive layer is disposed at a position where the outer sidewall of the fixing member 130 is attached to the inner sidewall of the wiring hole 111. Therefore, the waterproofing at the wiring hole 111 can be further enhanced.

Figure 7:
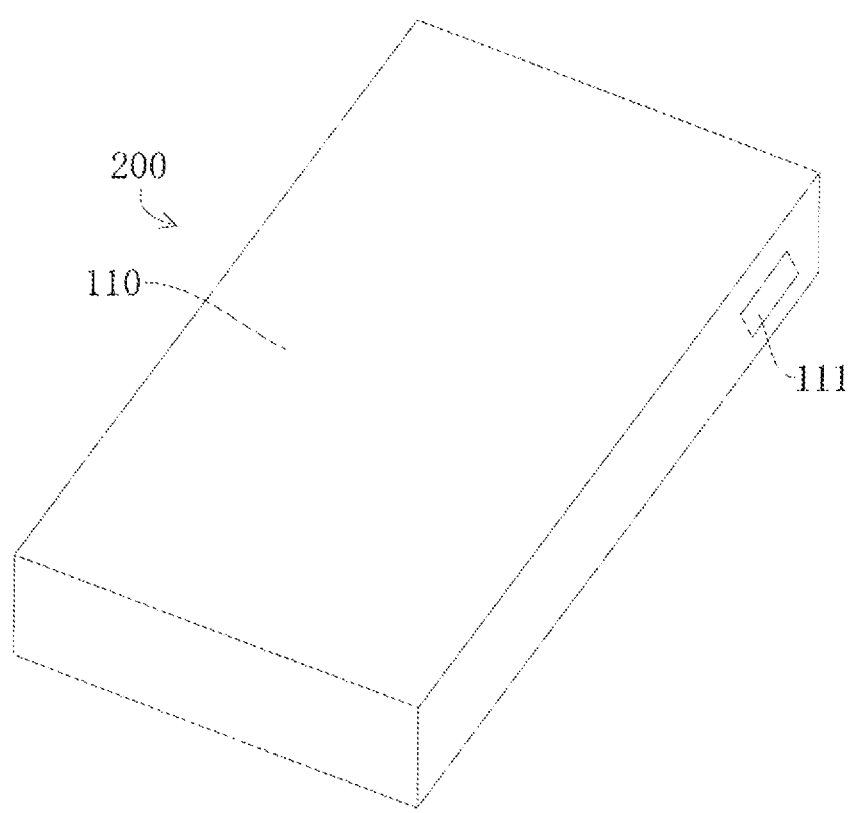
FIG. 7 is diagram showing a perspective structure of a mobile terminal according to an embodiment of the present disclosure.

As illustrated in FIG. 7, a mobile terminal 200 of an embodiment of the present disclosure includes the housing assembly 100 as described in the foregoing embodiments.

In the mobile terminal 200 according to the embodiment of the present disclosure, by attaching the fixing member 130 on the circuit board 120 and installing the circuit board 120 on the housing body 110 with aid of the fixing member 130, the assembling process of the housing assembly 100 can be simplified and the efficiency of the assembling can be improved. Additionally, with the outer sidewall of the fixing member 130 being attached to the inner sidewall of the wiring hole 111, liquid can be prevented from entering the interior of the housing body 110 through the wiring hole 111, thereby effectively enhancing the waterproofing of housing body 110.

Reference throughout this specification to "an embodiment," "some embodiments," "one embodiment", "another example," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been illustrated and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A housing assembly of a mobile terminal, comprising a housing body comprising a wiring hole;
   a circuit board disposed in the housing body and comprising an end that passes through the wiring hole and extends out of the housing body; and
   a fixing member sleevedly attached to the circuit board and engaging with the circuit board, wherein an outer sidewall of the fixing member is attached to an inner sidewall of the wiring hole;
   wherein the fixing member comprises:
   a body portion being sleevedly mounted on the circuit board; and
   a stopper portion mounted on the body portion and close to an exterior of the housing body; the stopper portion protruding out from an outer peripheral wall of the body portion and extending in a peripheral direction of the body portion, a side of the stopper portion being aligned with an outer peripheral wall of a side of the body portion, and the other side of the stopper portion opposite to the side of the stopper portion protruding from an outer peripheral wall of the other side of the body portion opposite to the side of the body portion.

2. The housing assembly as claimed in claim 1, wherein the housing body has a stopper slot in communication with the wiring hole, and wherein the stopper portion is embedded in the stopper slot.

3. The housing assembly as claimed in claim 1, wherein the outer sidewall of the fixing member is provided with at least one protrusion and the protrusion protrudes from the outer sidewall of the fixing member.

4. The housing assembly as claimed in claim 3, wherein the at least one protrusion is bar-shaped or ring-shaped and extends in a peripheral direction of the fixing member.

5. The housing assembly as claimed in claim 3, wherein the at least one protrusion comprises a plurality of protrusions which are arranged at intervals in an extension direction of the circuit board.

6. The housing assembly as claimed in claim 3, wherein the at least one protrusion comprises a plurality of protrusions arranged at intervals in a peripheral direction of the fixing member.

7. The housing assembly as claimed in claim 3, wherein a free end of the protrusion is provided with a curved surface.

8. The housing assembly as claimed in claim 1, wherein an adhesive layer is mounted between the outer sidewall of the fixing member and the inner sidewall of the wiring hole.

9. The housing assembly as claimed in claim 1, wherein the circuit board is a flexible circuit board.

10. The housing assembly as claimed in claim 1, wherein the fixing member is an elastic fixing member.

11. A mobile terminal comprising a housing assembly and electronic components, the housing assembly comprising
    a housing body comprising a wiring hole and accommodating the electronic components;
    a circuit board disposed in the housing body and comprising an end that passes through the wiring hole and extends out of the housing body; and
    a fixing member being sleevedly attached to the circuit board and engaging with the circuit board, wherein an outer sidewall of the fixing member is attached to an inner sidewall of the wiring hole;
    wherein the fixing member comprises:
    a body portion sleevedly mounted on the circuit board; and a stopper portion mounted on the body portion and close to an exterior of the housing body; the stopper portion protruding out from an outer peripheral wall of the body portion and extending in a peripheral direction of the body portion, a side of the stopper portion being aligned with an outer peripheral wall of a side of the body portion, and the other side of the stopper portion opposite to the side of the stopper portion protruding from an outer peripheral wall of the other side of the body portion opposite to the side of the body portion.

12. The mobile terminal as claimed in claim 11, wherein the housing body has a stopper slot in communication with the wiring hole, and wherein the stopper portion is embedded in the stopper slot.

13. The mobile terminal as claimed in claim 12, wherein the outer sidewall of the fixing member is provided with at least one protrusion.

14. The mobile terminal as claimed in claim 13, wherein the at least one protrusion comprises a plurality of the protrusions which are arranged at intervals in an extension direction of the circuit board.

15. The mobile terminal as claimed in claim 13, wherein at least one protrusion comprises a plurality of the protrusions which are arranged at intervals in a peripheral direction of the fixing member.

\* \* \* \* \*